United States Patent [19]
Webb et al.

[11] 4,428,810
[45] Jan. 31, 1984

[54] METHOD AND APPARATUS FOR DEPOSITING CONDUCTING OXIDE ON A SUBSTRATE

[75] Inventors: James B. Webb; Digby F. Williams; Margaret A. Buchanan, all of Ottawa, Canada

[73] Assignee: Canadian Patents and Development Limited, Ottawa, Canada

[21] Appl. No.: 377,324

[22] Filed: May 12, 1982

[51] Int. Cl.³ .............................................. C23C 15/00
[52] U.S. Cl. ............................ 204/192 P; 204/192 R; 204/298
[58] Field of Search ................ 204/192 P, 298, 192 R

[56] References Cited
U.S. PATENT DOCUMENTS 3,477,936  11/1969  Gillery et al. .................... 204/192 P
3,506,556   4/1970  Gillery et al. .................... 204/192 P

OTHER PUBLICATIONS

Hanak, Proc. 6th Internl. Vacuum Cong. 1974, Japan, J. Appl. Phys. Suppl. 2, Part 1, 1974, p. 809.
Dakss et al., IBM Tech. Disc. Bull., Oct. 1970, vol. 13, No. 5, pp. 1176–1178.
Michel et al., IBM Tech. Disc. Bull., vol. 13, No. 5, Oct. 1970, p. 3790.

*Primary Examiner*—Arthur P. Demers
*Attorney, Agent, or Firm*—R. William Wray & Associates

[57] ABSTRACT

There is described a method and an apparatus for depositing oxide, such as zinc oxide, on a substrate by R.F. magnetron sputtering. The oxide deposit is "switched" from a non-conducting to a highly conducting material by a second discharge caused by a voltage applied to a screen grid immediately in front of the substrate, or is rendered conducting by a heating step.

20 Claims, 2 Drawing Figures

METHOD AND APPARATUS FOR DEPOSITING CONDUCTING OXIDE ON A SUBSTRATE

BACKGROUND OF THE TECHNOLOGY

As disclosed in U.S. Pat. No. 3,506,556 (Apr. 14, 1970—Gillery et al), the deposition of metals and metal-oxide films by cathodic sputtering is a well-known process. The text "Vacuum Deposition of Thin Films", by Holland, Published by Chapman and Hall, Ltd., London, (1963) is referred to and discusses the technology of cathodic sputtering.

In cathodic sputtering processes, an atmosphere at greatly-reduced pressure is necessary to provide the proper conditions for a glow discharge to occur between cathode and anode. A glow discharge energizes ions present between the cathode and anode. Pyrolyzation is another technique for depositing metal oxide films on a substrate and comprises contacting the heated substrate with a metal salt or organo-metallic compound which pyrolyzes at the temperature of the substrate to form thereon an adherent metal oxide film. This technique has disadvantages but metal oxide films regardless of the method of application, have one disadvantage in comparison with metal films: low conductivity.

One method of improving the conductivity of metal oxide film has been to "dope" with another metal, preferably one of a higher valence.

U.S. Pat. No. 3,506,556 is concerned with producing conductive metal oxide films by cathodic sputtering. It is particularly concerned with cathodic sputtering from a metal having an atomic number between 48 and 51, particularly indium in an atmosphere containing hydrogen and oxygen.

SUMMARY OF THE PRESENT INVENTION

According to one aspect of the present invention there is provided a method for forming on a substrate a conductive oxide film comprising: feeding into a magnetron sputtering apparatus a gaseous composition containing a reactive gas of hydrogen and an inert gas, magnetron sputtering a target consisting essentially of high purity oxide in said gaseous composition, and maintaining said substrate at a temperature whereby the conductivity of the oxide is caused to change to a value greater than 50 ohm$^{-1}$cm$^{-1}$.

According to another aspect of the present invention there is provided apparatus for forming on a substrate a conductive oxide film having a conductivity greater than 50 ohm$^{-1}$cm$^{-1}$ comprising: a magnetron sputtering device for sputtering a target, consisting of high purity oxide, means for feeding a gaseous composition containing a reactive gas of hydrogen and an inert gas into the apparatus, means for supporting said substrate in position for sputtering, a screen grid mounted in front of said substrate, and means for maintaining the temperature of said substrate such that the conductivity of the conductive oxide film is greater than 50 ohm$^{-1}$cm$^{-1}$.

BRIEF DESCRIPTION OF THE DRAWINGS

An embodiment of the invention will now be described, by way of example, with reference to the accompanying drawings in which.

DESCRIPTION OF THE SPECIFIC EMBODIMENTS

The increasing use of transparent, conductive films for liquid crystal displays, I.R. reflective coatings and more recently for window-junctions in SIS photovoltaic solar cells, has resulted in research in film deposition, particularly for less expensive coatings.

We discovered that films of zinc oxide with high conductivity and optical transparency can be prepared by reactive R.F. magnetron sputtering from an oxide target. In a first embodiment, it has been found that by introducing hydrogen and raising the temperature of the substrate we can obtain a film of zinc oxide, with a conductivity greater than 50 ohm$^{-1}$cm$^{-1}$.

In a second embodiment the substrate can, if desired, be at room temperature and the conductivity of the zinc oxide is switched from a low conductive or a non-conductive state to a highly conductive state with a conductivity greater than 10$^2$ohm$^{-1}$cm$^{-1}$ by means of a second discharge as a result of a voltage applied to a screen grid. The wide choice of satisfactory substrate materials (substrates are at room temperature during deposition) and lack of any post deposition treatment to achieve optimum characteristics, are of particular importance for large scale use of this material as a transparent conductive coating.

Zinc oxide is particularly significant for large scale coating applications because of its low cost and films of this material appear to represent a high value of conductivity. Using a technique according to the second embodiment of the invention using reactive R.F. magnetron sputtering, we have achieved the deposition of highly conductive ($7 \times 10^2 \Omega^{-1}$-cm$^{-1}$) films of zinc oxide with high optical transparency ($>90\% \lambda = 4000 \rightarrow 8000$ Å for a 1000 Å thick film). It was possible to deposit films on a wide range of substrate materials and the films required no post-preparative treatment to achieve optimum characteristics.

The deposition was achieved by utilizing a second low power/ionizing discharge to initiate growth of the highly conductive material on room temperature substrates. Turning on the second ionizing discharge, during the deposition of insulating zinc oxide (ZnO), causes the deposition to "switch" from low conductivity to high conductivity material. As will be appreciated this is of particular interest in the fabrication of SIS (semiconductor-insulator-semiconductor) solar cells where precise control over the thickness of the insulating layer is necessary and where a highly transparent and conductive window-junction layer is required.

Figure 1:
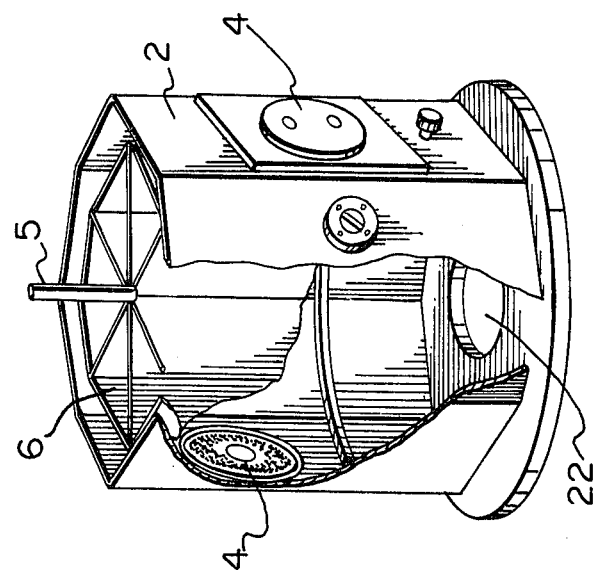
FIG. 1 is a diagrammatic representation of an R.F. sputtering apparatus partially cut-away to reveal details thereof.

In FIG. 1 an R.F. magnetron sputtering apparatus is diagrammatically illustrated. The sputtering apparatus comprises a vacuum sputtering chamber 2 which contains three magnetron target assemblies 4. The substrate holder 5 is constructed as a carousel assembly which is caused to rotate in front of the three sputtering target assemblies 4 (only two being visible in the FIG. 1). One target assembly only was used for the zinc oxide films and a substrate 6 secured to the carousel holder 5 was rotated to a fixed position in front of a zinc oxide target 4.

Figure 2:
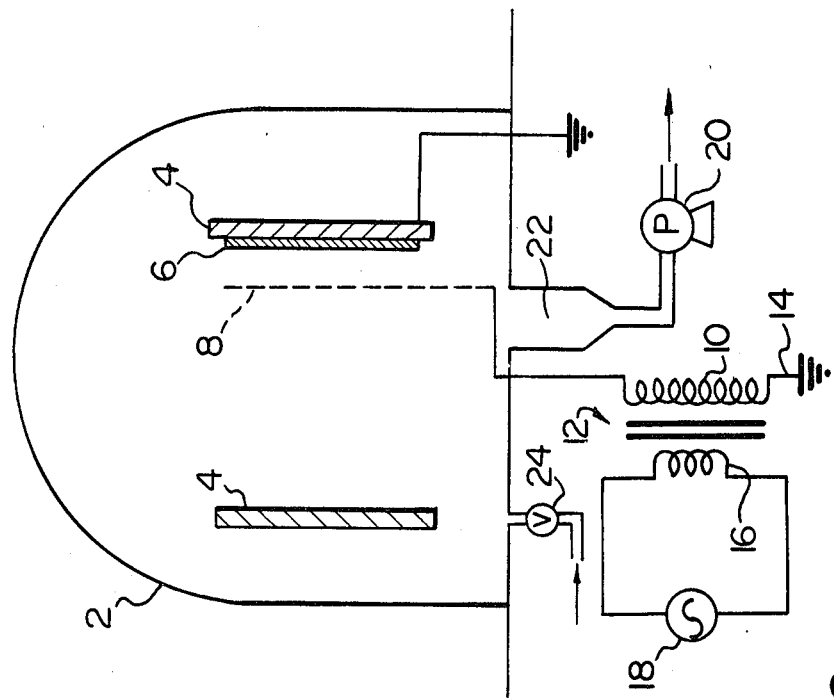
FIG. 2 is a diagrammatic representation of part of the apparatus of FIG. 1 and showing additional details of the apparatus.

FIG. 2 is a diagrammatic representation of part of the arrangement of FIG. 1 and showing additional details thereof. A single course mesh wire screen grid 8 is mounted immediately in front of the substrate 6 but is electrically isolated from the substrate.

The screen grid 8 is electrically connected to one side of the secondary winding 10 of a transformer 12 (at least of 1 watt rating at 3 kv), whose other side is grounded at 14. The transformer's primary winding 16 is connected across the output of a 2–20 KHz voltage generator 18. It was found that a very low power less than one watt, was required in the constructed embodiment to produce the required ionizing discharge at screen grid 8. Adjustments may, of course, be made to produce the required discharge.

A vacuum pump 20 (FIG. 2) is connected at 22 to obtain the required vacuum and a reactive gaseous composition consisting essentially of hydrogen and argon could be introduced through an inlet port 24.

Films were deposited from a hot pressed zinc oxide target (from Materials Research Corporation) using a vertical cathode R.F. sputtering system. The sputtering system was a Vac Tek Inc. system and, typically was pumped down cryogenically to approximately $10^{-7}$ Torr then throttled to $\sim 5 \times 10^{-7}$ Torr and argon added to achieve a background sputtering pressure of 5 mTorr. A feedback system to the R.F. supply was used to maintain a constant self-bias voltage during deposition. Substrate temperature was controlled via quartz heaters and the substrates were pyrex glass (1"×3"). Reactive gases could be added to the discharge via controlled leak valves—the added partial pressure of reactive gas being measured by an ionization gauge prior to initiating the sputter discharge. Film thicknesses were measured with a Sloan Dektak profilometer and optical transmission measurements with a Cary 219 spectrophotometer. Hall effect measurements were performed to characterize the films electrically.

We have found that by the production of the second low power ionizing discharge at the substrate, by way of screen grid 8, we can initiate growth of a highly conductive zinc oxide material on substrates, such as 6 in FIGS. 1 and 2. The second discharge causes the zinc oxide deposition to "switch" from low conductivity to high conductivity material, when the substrate was at room temperature. The substrate may, of course, be of any suitable material, for example, glass.

Although the exact theory of the embodiments of the invention is not understood, it is thought that the second discharge would appear to enhance the number or types of nucleation centres on the substrate, thus defining the defect density (zinc interstitials, oxygen vacancies, etc.) of the growing film. It does not appear to be related to a simple "cleaning" of the substrate since an insulating layer of zinc oxide grown at R.T., $1 \times 10^{-5}$ Torr $H_2$ and second discharge off, can be coated with a highly conductive layer of zinc oxide during the same deposition cycle simply by turning on "momentarily" the second discharge. Furthermore, the reproducibility of the electrical properties of the films is increased $-\pm 50\%$. This would be expected on the basis of increased control over the type of nucleation centre produced.

In the experimental work leading up to the present invention, films prepared on substrates at 293 $K \leq T \leq 473$ K were highly insulating $>10^8 \Omega$-cm with high optical transparency $>90\%$ averaged over the visible spectrum. To increase the conductivity of the films, we did attempt doping via changes in the stoichiometry through the addition of hydrogen to the sputter discharge.

For substrate temperatures 330 K<T<430 K the conductivity of the films increased with increasing hydrogen to a maximum value of $50\Omega^{-1}$-cm$^{-1}$ at an added partial pressure of $1 \times 10^{-5}$ Torr, substrate temperature $T_s = 330$ K and a deposit rate of 1 Å/s. Further increases in the hydrogen partial pressure resulted in a decrease in film conductivity. The maximum in the conductivity remained at $1 \times 10^{-5}$ Torr $H_2$ independent of the substrate temperature and deposit rate; however increasing the substrate temperature and/or incident R.F. power resulted in a slow decrease in the absolute value of the conductivity maximum, while decreasing $T_s$ below 330 K gave a very rapid decrease in conductivity (10 orders of magnitude at $T_s = 293$ K).

The second low power discharge was then provided near the substrate using the wire screen grid 8 and a high voltage coil operating at approximately 20 kHz. Total power in this discharge was less than 1 watt. The optimal value of conductivity increased by more than an order of magnitude to $\sim 600 \ \Omega^{-1}$-cm$^{-1}$, —however this maximum value was still produced with a hydrogen partial pressure of $1 \times 10^{-5}$ Torr and deposition rate of 1 Å/s. Two important observations were noted. Firstly, the maximum in conductivity could be obtained on substrates held at room temperature where previously insulating films were obtained and secondly, this second discharge was required only during the initial growth period of the film, (the first 5 minutes of a 30 minute deposit, for example). Once the high conductivity film growth was initiated, the film continued to grow in this state after removal of the initiating discharge.

The carrier concentration and mobility of these films are summarized in Table 1. All films showed a conductivity independent of thickness (for thicknesses >300 Å) and no changes in conductivity due to long term target compositional changes were observed.

TABLE 1

| Sample | $H_{2pp}$ (Torr) | Substrate Temp. (K) | $\eta$ (cm$^{-3}$) | $\mu$ (cm$^2$/V-s) | $\sigma$ ($\Omega^{-1}$-cm$^{-1}$) |
|---|---|---|---|---|---|
| Z33 | $1 \times 10^{-5}$ | 315 | $4.0 \times 10^{19}$ | 8.0 | 52.6 |
| Z24 | $1 \times 10^{-5}$ | 293 | $<10^{-8} \Omega^{-1}$-cm$^{-1}$ | | |
| Z18* | $1 \times 10^{-5}$ | 293 | $1.1 \times 10^{20}$ | 8.0 | 714 |
| Z21* | $5 \times 10^{-6}$ | 293 | $4.7 \times 10^{19}$ | 7.0 | 52.6 |
| Z23* | $5 \times 10^{-5}$ | 293 | $4.0 \times 10^{19}$ | 3.0 | 19.2 |

*Second discharge on for first 5 min of a 20 min deposit.

Electron diffraction of the sputtered films showed a strong orientation with the c-axis ±10° normal to the substrate. SEM photographs indicated columnar growth and no differences could be observed either in the diffraction or SEM studies between films prepared with or without the use of the second discharge. The role of the second discharge with screen grid 8 appears to be related to nucleation effects, —however the nature of these effects requires further study.

To summarize, it can be said that the use of a second low power discharge near the substrate surface has been found to alter the growth of zinc oxide films. A film growing in the insulating state at $\sim 10^{-8} \Omega^{-1}\text{-cm}^{-1}$ ($T_s = 293$ K, $H_{2pp} = 1 \times 10^{-5}$ Torr and deposit rate of 1 Å/s) can be "switched" to a highly transparent and conducting state $\sim 10^{+3} \Omega^{-1}\text{-cm}^{-1}$ by momentarily turning on the second discharge with screen grid 8.

It would appear that the method and apparatus may be applicable to oxide materials other than zinc oxide but further investigation in this area seems desirable. However, an expert skilled in this art should have no difficulty in applying the method and apparatus to appropriate materials.

It will be readily apparent to a person skilled in the art that a number of variations and modifications can be made without departing from the true spirit of the invention which will now be pointed out in the appended claims.

We claim:

1. A method for forming on a substrate a conductive oxide film comprising:
    (a) feeding into a magnetron sputtering apparatus a gaseous composition containing a reactive gas of hydrogen and an inert gas,
    (b) magnetron sputtering a target consisting essentially of high purity oxide in said gaseous composition, and
    (c) maintaining said substrate at a temperature whereby the conductivity of the oxide is caused to change to a value greater than 50 ohm$^{-1}$cm$^{-1}$.

2. A method for forming on a substrate a conductive oxide film comprising:
    (a) feeding into a magnetron sputtering apparatus a gaseous composition containing a reactive gas of hydrogen and an inert gas,
    (b) magnetron sputtering a target consisting essentially of high purity oxide in said gaseous composition, and
    (c) heating said substrate to a temperature whereby the conductivity of the conductive oxide film is greater than 50 ohm$^{-1}$cm$^{-1}$.

3. A method according to claim 2 including the step of selecting zinc oxide as said high purity oxide.

4. A method according to claim 2 including the step of selecting argon as said inert gas.

5. A method according to claim 3 including the step of selecting argon as said inert gas.

6. A method for forming on a substrate a conductive oxide film having a conductivity greater than $10^2$ohm$^{-1}$cm$^{-1}$ comprising:
    (a) feeding into a magnetron sputtering apparatus a gaseous composition containing a reactive gas of hydrogen and an inert gas,
    (b) magnetron sputtering a target consisting essentially of high purity oxide in said gaseous composition, and
    (c) introducing a second discharge during the deposition of oxide so as to switch the conductivity of the film to a highly conductive state with a conductivity greater than $10^2$ohm$^{-1}$cm$^{-1}$.

7. A method according to claim 6 including the step of selecting zinc oxide as said high purity oxide.

8. A method according to claim 6 including the step of selecting argon as said inert gas.

9. A method according to claim 7 including the step of selecting argon as said inert gas.

10. Apparatus for forming on a substrate a conductive oxide film having a conductivity greater than 50 ohm$^{-1}$cm$^{-1}$ comprising:
    (a) a magnetron sputtering device for sputtering a target consisting of high purity oxide,
    (b) means for feeding a gaseous composition containing a reactive gas of hydrogen and an inert gas into the apparatus,
    (c) means for supporting said substrate in position for sputtering, and,
    (d) means for maintaining the temperature of said substrate such that the conductivity of the conductive oxide film is greater than 50 ohm$^{-1}$cm$^{-1}$.

11. Apparatus for forming on a substrate a conductive oxide film having a conductivity greater than 50 ohm$^{-1}$cm$^{-1}$ comprising:
    (a) a magnetron sputtering device for sputtering a target consisting of high purity oxide,
    (b) means for feeding a gaseous composition containing a reactive gas of hydrogen and an inert gas into the apparatus,
    (c) means for supporting said substrate in position for sputtering, and
    (d) means for heating said substrate to a temperature whereby the conductivity of the conductive oxide film is greater than 50 ohm$^{-1}$cm$^{-1}$.

12. Apparatus according to claim 11 wherein said high purity oxide is zinc oxide.

13. Apparatus according to claim 11 wherein said inert gas is argon.

14. Apparatus according to claim 12 wherein said inert gas is argon.

15. Apparatus according to claim 11, 12 or 13 wherein said means for supporting said substrate is a carousel holder.

16. Apparatus for forming on a substrate a conductive oxide film having a conductivity greater than $10^2$ohm$^{-1}$cm$^{-1}$ comprising:
    (a) a magnetron sputtering device for sputtering a target consisting essentially of high purity oxide,
    (b) means for feeding a gaseous composition containing a reactive gas of hydrogen and an inert gas,
    (c) means for supporting said substrate in position for sputtering,
    (d) a screen grid mounted in front of said substrate, and
    (e) means for applying a voltage to said screen grid whereby, in use, the film of oxide being deposited on said substrate changes from a substantially non-conductive to a highly conductive state greater than $10^2$ohm$^{-1}$cm$^{-1}$.

17. Apparatus according to claim 16 wherein said high purity oxide is zinc oxide.

18. Apparatus according to claim 16 wherein said inert gas is argon.

19. Apparatus according to claim 17 wherein said inert gas is argon.

20. Apparatus according to claim 16, 17 or 18 wherein said means for supporting said substrate is a carousel holder.

* * * * *